United States Patent [19]

Lamarre et al.

[11] Patent Number: 5,140,469

[45] Date of Patent: Aug. 18, 1992

[54] ILLUMINATION APPARATUS FOR SEMICONDUCTOR FABRICATION INCLUDING CONICAL OPTICAL MEANS

[75] Inventors: Philip A. Lamarre, Waltham; Robert L. Mozzi, Lincoln, both of Mass.

[73] Assignee: Raytheon Company, Lexington, Mass.

[21] Appl. No.: 816,793

[22] Filed: Jan. 3, 1992

Related U.S. Application Data

[63] Continuation of Ser. No. 592,087, Oct. 3, 1990, abandoned.

[51] Int. Cl.$^5$ .................. G02B 17/04; G02B 17/06; G02B 13/18; G03F 7/20
[52] U.S. Cl. ..................... 359/709; 359/837; 359/742; 359/738; 359/859; 430/11
[58] Field of Search ........... 350/432, 286, 452; 126/440; 219/121.75; 359/859

[56] References Cited

U.S. PATENT DOCUMENTS

| | | | |
|---|---|---|---|
| 2,882,784 | 4/1959 | Toffolo | 350/432 |
| 3,419,321 | 12/1968 | Barber et al. | 219/121.75 |
| 3,663,090 | 5/1972 | Miller | 350/383 |
| 4,312,330 | 1/1982 | Holdridge | 350/452 |
| 4,514,040 | 4/1985 | Pinelli et al. | 350/286 |
| 4,653,472 | 3/1987 | Mori | 126/440 |
| 4,909,587 | 3/1990 | Okamoto et al. | 350/452 |

Primary Examiner—Jon W. Henry
Attorney, Agent, or Firm—Denis G. Maloney; Richard M. Sharkansky

[57] ABSTRACT

A method of patterning a photoresist layer to provide an aperture having retrograde sidewalls is described. Illumination may be through a conical prism arrangement or a conical reflecting mirror and cylindrical mirror arrangement. The method includes the step of directing energy towards a mask which selectively exposes portions of a photoresist layer disposed on the substrate. The energy is directed to the mask at an oblique angle with respect to the normal to the surface of the substrate. The underlying photoresist layer is obliquely sensitized by the obliquely directed illumination. The portions of the layer which are obliquely sensitized are removed leaving behind an aperture having retrograde sidewalls. The retrograde sidewalls are a preferred photoresist profile for easy and reliable lift-off of deposited material from the semiconductor substrate.

5 Claims, 4 Drawing Sheets

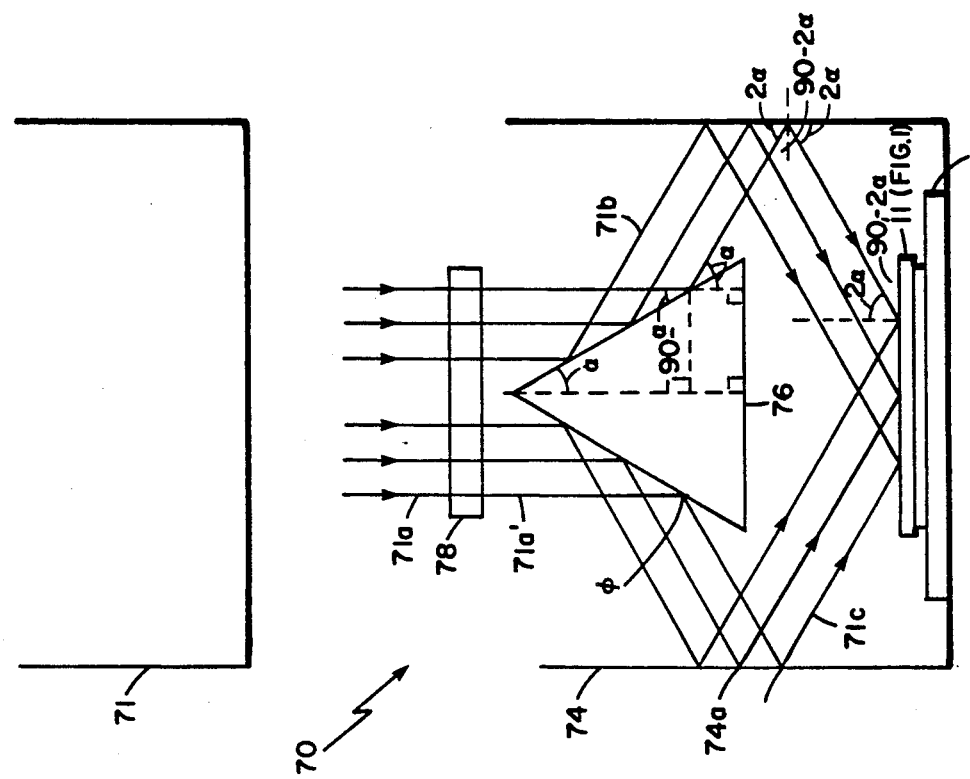
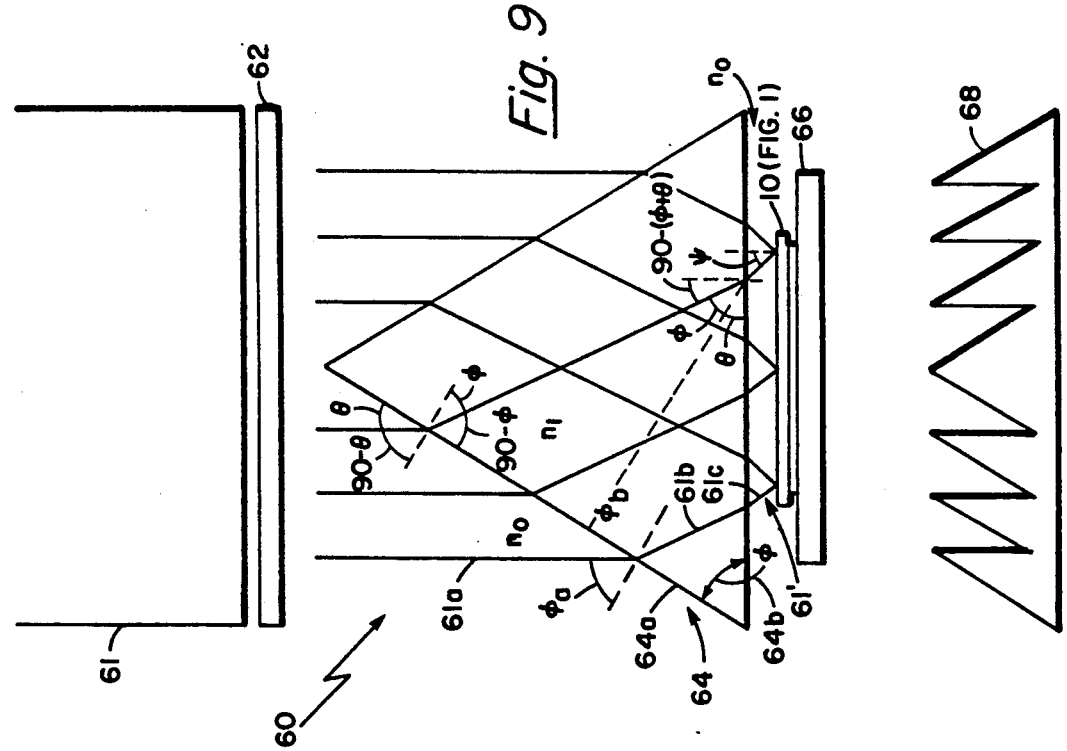

ILLUMINATION APPARATUS FOR SEMICONDUCTOR FABRICATION INCLUDING CONICAL OPTICAL MEANS

This application is a continuation of application Ser. No. 592,087 filed Oct. 3, 1990 now abandoned.

BACKGROUND OF THE INVENTION

This invention relates generally to semiconductor fabrication techniques and more particularly to semiconductor fabrication involving resist patterning techniques.

As is known in the art, fabrication of a semiconductor circuit, such as an integrated circuit, may include patterning of one or more resist layers to form patterns to permit the formation of patterned metal layers over a semiconductor substrate. Two types of metal patterning techniques are generally employed.

In one technique, a metal layer is deposited on the substrate and a resist layer is then deposited over the metal layer. The resist is patterned using conventional techniques to expose selected underlying portions of the metal layer. The exposed portions of the metal layer are then etched away and the resist is removed leaving behind a patterned metal layer.

In a second technique, a resist layer is deposited over the substrate. Apertures are formed in the resist layer to expose underlying portions of the substrate. A layer of metal is then deposited over the resist layer and through the apertures onto the exposed portions of the substrate. If the metal layers deposited through the apertures are discontinuous from the metal deposited over the resist layer, the resist layer can be simply dissolved away, carrying away the metal layer deposited on the resist while leaving behind the patterned metal layer on the substrate. This latter technique is generally referred to as "lift-off." In order to provide a patterned metal layer using the so-called lift-off technique, it is desirable that the metal layers deposited on the substrate be discontinuous from the metal layer deposited over the resist layer.

Although the technique appears to be relatively straight forward, a problem arises in achieving a suitable resist profile which enables easy and reproducible lift-off of the photoresist and, hence, the metal disposed over the photoresist without damaging the metal disposed on the substrate.

Many approaches have been proposed for providing a suitable resist profile to aid in the lift-off of the metal from the substrate. These techniques which include resist conditioning techniques, as well as double layer resist patterning techniques are used to provide patterned resist features having a profile suitable for insuring that the metal deposited over the resist is discontinuous from the metal deposited on the substrate. The double resist techniques, for example, although useful, are also time consuming and thus costly particularly for large scale production of semiconductor circuits.

Accordingly, it would be desirable to provide a technique more suitable for a production environment which also provides more consistent results to make lift-off a relatively fast, easy, and reproducible processing step.

SUMMARY OF THE INVENTION

In accordance with the present invention, a method of forming an aperture in a photoresist layer, said aperture having retrograde sidewalls comprises the step of directing energy towards said photoresist layer at an oblique angle with respect to the surface of said photoresist layer to obliquely sensitize a selected portion of the photoresist layer. With such an arrangement, the obliquely directed energy will sensitize the selected portions of the photoresist layer. The selected portion will have retrograde or inward slanting interfacial regions between senitized and unsenitized portions of the photoresist due to the obliquely directed illumination. After exposure, the resist layer is developed in accordance with conventional techniques for the particular resist chosen, and the developed or sensitized photoresist portions are washed away leaving a patterned photoresist layer with an aperture having retrograde sidewalls. That is, the aperture will have a larger dimension at the bottom portion of the aperture adjacent to the substrate than the corresponding dimensions at the upper portion of the aperture. This so-called retrograde sidewall profile is the desired profile for easy and reliable lift-off of metals deposited over the photoresist and through the aperture since the retrograde sidewall insures a discontinuity between the material deposited in the aperture and that deposited over the resist. Metal may then be disposed in the aperture by directing metal at a substantially normal incidence to the aperture. With the retrograde sidewalls provided in the aperture, suitable separation is provided between the metal disposed in the aperture and the metal disposed over the resist, permitting the resist to be "lifted-off" from the substrate without disturbing the metal disposed on the substrate.

In accordance with a further aspect of the present invention, apparatus for providing oblique illumination to a substrate comprises a collimated source of optical energy and means for directing the collimated source of optical energy at an oblique angle with respect to a normal to the surface of the substrate. In a preferred embodiment, the means for directing collimated energy at a oblique angle includes at least one prism, preferably a right angle prism disposed in the path of said collimated energy. With such an arrangement, the prism can be used to bend the collimated energy to form the desired radiation pattern for exposing of the underlying resist material on the substrate. In addition, a plurality of such prisms may be disposed to form an annulus over said substrate. This arrangement would provide a uniform radiation density over the surface of the resist.

Alternatively, said means for directly energy at an oblique angle includes conical means disposed in the path of said energy and arranged to direct said energy at the oblique angle to the resist surface. In a first embodiment, the conical means includes a transmitting conical prism arranged in the path of the collimated source of energy, said transmitting conical prism having an incident surface disposed at an angle with respect to an exiting surface of the prism related to an angle at which the energy is obliquely directly to the substrate. With this particular arrangement, the transmitting conical prism may be retrofitted within an existing collimated source of illumination and thus provide a desired radiation field to expose a resist coated substrate disposed adjacent the exiting surface of the prism.

In a second embodiment, the conical means includes a conical reflecting mirror disposed within a reflecting cylindrical mirror. Preferably, the collimated incident energy is first directed through a radial gradient neutral density filter. The filtered collimated energy leaves the filter and strikes a first reflecting surface of the conical mirror causing incident energy rays to be reflected off said surface towards the reflecting cylindrical mirror. The rays are reflected off the cylindrical mirror towards the substrate at an oblique angle related to the angle of incidence of the radiation reflected off the conical mirror. With this particular arrangement, a simple optical apparatus may be placed within an existing optical projection apparatus to provide the desired radiation pattern for a lift-off process. The optical apparatus may then be removed from the optical projection apparatus for conventional exposures.

BRIEF DESCRIPTION OF THE DRAWINGS

The foregoing features of this invention, as well as the invention itself, may be fully understood from the following detailed description of the drawings, in which:

FIG. 9 is a diagrammatical view of a second technique using a transmitting conical prism to provide obliquely directed illumination to a masking pattern;

FIG. 9A is a cross-sectional view depicting a Fresnel lens reduction equivalent to the arrangement shown in FIG. 9; and FIG. 10 is a diagrammatical view of a third technique using a reflecting conical mirror to provide obliquely directed illumination to a masking pattern.

DESCRIPTION OF THE PREFERRED EMBODIMENTS

Figure 1:
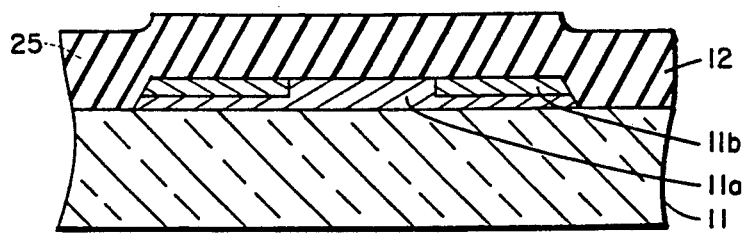
FIGS. 1-4 are a series of cross-sectional views showing the steps in forming resist patterns having retrograde sidewalls for providing source and drain electrodes on a field effect transistor.

Referring now to FIG. 1, a substrate 11 here comprising gallium arsenide, silicon, or other suitable semiconductor-type of substrate material is shown to include an active layer 11a, here a mesa-shaped active layer, having contact layers 11b disposed over a first surface thereof. Here the device to be described, in particular, is a so-called metal semiconductor field effect transistor (MESFET) having an active layer comprised of gallium arsenide with a typical dopant concentration of silicon, typically around $1 \times 10^{17}$ atoms/cc and contact layers 11b each having a dopant concentration of silicon generally exceeding $1 \times 10^{18}$ atoms/cc. In general, source and drain electrodes are disposed over the contact layers 11b and are alloyed therewith to form low resistivity ohmic type contacts, whereas a gate electrode is disposed in a region of said active layer 11a between said source and drain electrodes to form a Schottky barrier contact with said active layer. Although the example chosen herein is the fabrication of a MESFET, it is to be understood that fabrication of other types of transistors using substrate materials other than gallium arsenide as well as other circuit features such as strip conductors, interconnecting conductors for digital circuits and the like may be provided using resist patterning techniques to be described forthwith.

Returning to FIG. 1, disposed over substrate 11, active layer 11a, and contact layers 11b is a resist layer 12 here comprised of any known photoresist. An example of a suitable photoresist for patterning source and drain electrodes is Shipley (Newton, Mass.) type 1400 series, postive photoresist.

Figure 2:
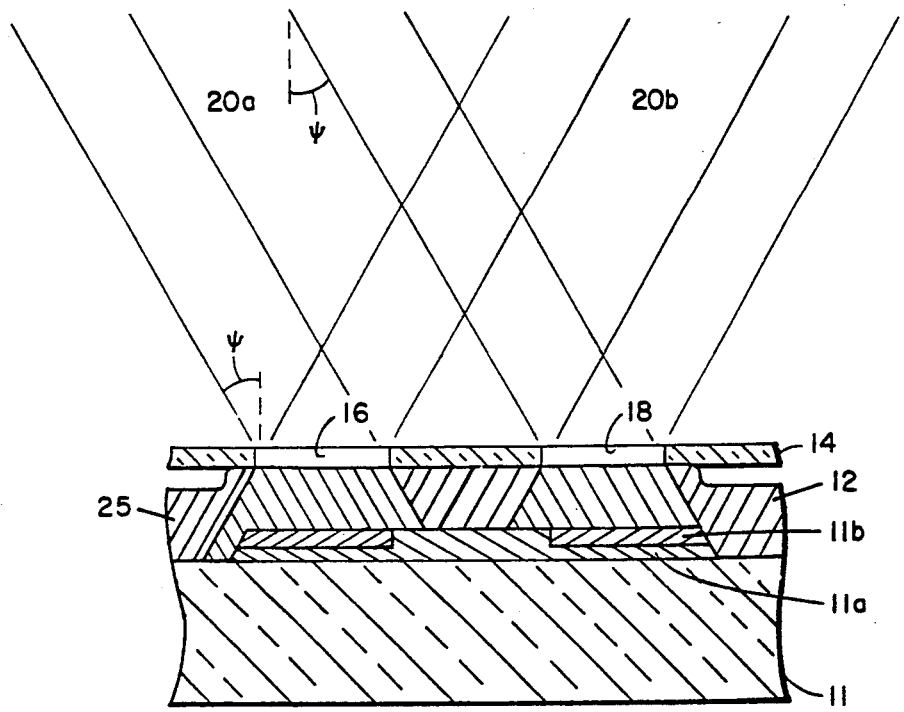

Referring now to FIG. 2, a mask 14 having apertures 16 and 18 is here disposed in contact with photoresist layer 12. The apertures 16, 18 are aligned with suitable portions of the contact layers 11b using conventional alignment techniques as are known. As further shown in FIG. 2, collimated optical energy patterns 20a, 20b are each directed at an oblique angle $\psi$ with respect to a normal to the surface of masking layer 14 through aperture 16 and 18 as shown. The optical energy represented by ray patterns 20a, 20b sensitizes the resist directly under the mask openning, as well as selected underlying portions of the resist layer 12 covered by the mask but which are in-line with the obliquely directed illumination which shines through the patterns 16 and 18 in the mask 14. That is, adjacent underlying portions of the resist layer 12 which are in the path of the obliquely directed optical energy patterns 20a, 20b are also sensitized by said obliquely directed optical energy. This provides sensitized areas 22, 24 spaced by unsensitized areas 25.

Figure 3:
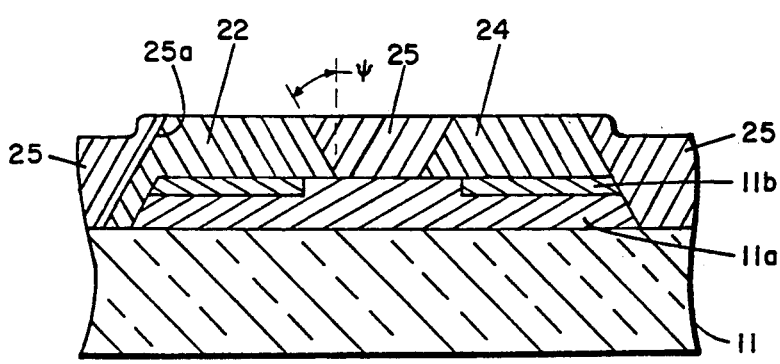

Referring now to FIG. 3, after exposure of the resist, the mask 14 is removed from the masking layer 12 and the masking layer 12 now includes the pair of sensitized areas 22 and 24 spaced by unsensitized areas 25. The boundaries 25a between the sensitized areas 22 and 24 and the adjacent unsensitized areas 25 are at oblique angles $\psi$ with respect to a normal to the surface of the substrate 11. This obliquely illuminated pattern is then developed using conventional techniques for the particular resist type selected.

It should be noted that strong reflections from the surface may change the pattern of the exposed resist. However, the normal absorption of the photoresist generally precludes this from occuring. In the event that a resist were highly transparent antireflection coatings and dyes which are commercially available could be used to reduce strong reflections.

Figure 4:
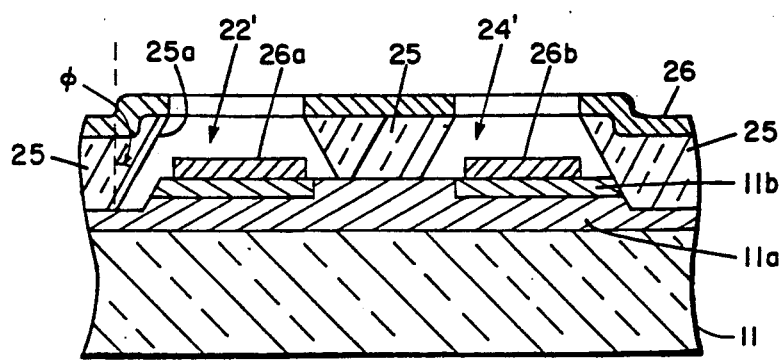

Referring now to FIG. 4, after the resist layer 12 is developed in a suitable chemical developer, exposed portions 22 and 24 thereof are washed away. The unexposed, unsensitized portions 25 remain however, leaving a patterned resist having apertures 22', 24' with retrograde sidewall portions 25a, as shown. That is, sidewall portions 25a of apertures 22' and 24' form an oblique angle $\phi$ with respect to the surface of substrate 11. Thus, apertures 22' and 24' are provided having dimensions at the upper portions thereof which are smaller then the corresponding dimensions at lower portions thereof. This so-called retrograde profile for the sidewalls 25 is a desirable resist profile to facilitate a lift-off of the photoresist, as will now be described.

As also shown in FIG. 4, a layer of metal 26 is deposited over the substrate 11. Layer 26 is deposited using any conventional semi-collimated deposition technique such as evaporation (i.e. sputtering and other non-collimated techniques are generally inappropriate for lift-off processes). Portions 26a, 26b of layer 26 are also deposited through apertures 22' and 24' provided through resist layer 12 as shown. Since the sidewalls of apertures 22' and 24' have a retrograde profile, that is such sidewalls slant in, towards the openings or upper portions of the apertures, the metal layer deposited on the resist layer will be sufficiently separated or discontinuous from the metal layer regions 26a, 26b deposited within the apertures 22' and 24'.

Figure 5:
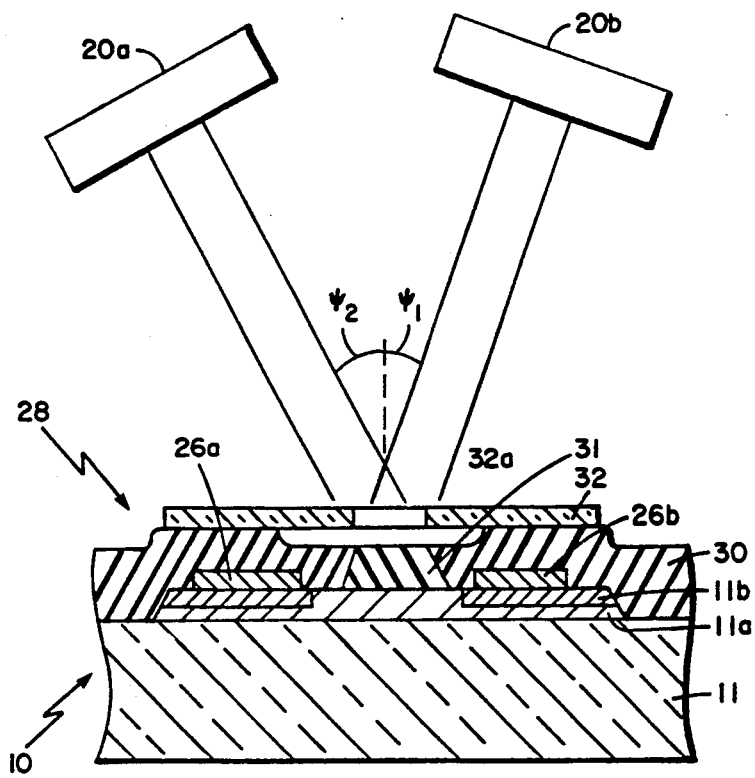
FIGS. 5-6 are cross-sectional views showing steps in providing a resist pattern having retrograde sidewalls for providing a gate electrode for a field effect transistor.

Referring now to FIG. 5, the metal layer 26, which may be deposited to a desired thickness, is reproducibly and reliably removed without disturbing metal layer regions 26a, 26b by stripping away the resist layer 12 using conventional techniques for the particular resist type chosen. Since layer 26 is discontinuous from regions 26a and 26b because of the retrograde sidewalls, layer 26 (FIG. 4) is removed or "lifted-off" from the substrate by removing the resist without disturbing the underlying patterned metal layers 26a and 26b.

Accordingly, electrodes 26a and 26b, which here provide the drain and source electrodes respectively for the transistor 10, are provided using a lift-off technique having a high degree of reproducibility. A gate electrode 27 (FIG. 6) is also disposed between source and drain electrodes and may be fabricated using a similar photoresist lift-off technique, as will now be described.

Still referring to FIG. 5, a second layer of resist 30 is shown disposed over substrate 11 and over active region 11a and contact regions 11b. Here the photoresist is any standard azide type as the 1400 type mentioned above. A contact mask 32 is shown disposed over the photoresist layer 30. The contact mask 32 has a pattern which exposes an underlying portion of the photoresist layer 30. Such pattern is transferred to said photoresist layer 30 to form an opening therein to provide a gate electrode and a gate recess etch in the active layer of the device. Here a pair of sources of illumination (not shown) are shown directing beams of energy 20a, 20b (FIG. 2) towards the opening 32a in the mask 32. Here, however, unlike the predecessor illumination step forming source and drain electrodes, the sources of illumination 20a and 20b are disposed at different oblique angles $\psi_1$ and $\psi_2$ with respect to a normal to the surface of the substrate. Here $\psi_2$ is a shallower angle than $\psi_1$. Resulting from this illumination is a retrograde profile 31 in the photoresist layer 30. Here, however, the retrograde profile 31 is an asymmetric profile having a bottom portion which is disposed or biased towards the drain electrode 26b.

Figure 6:
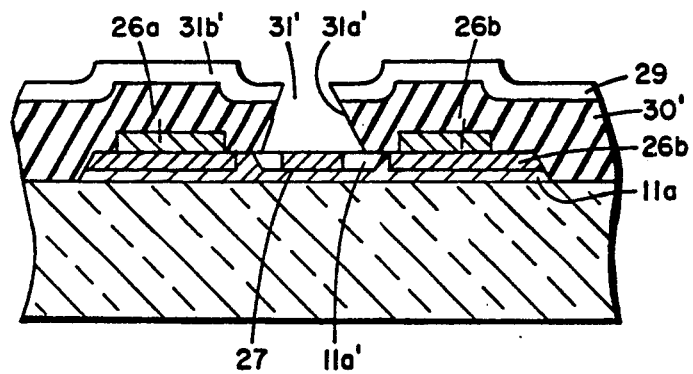

Referring now to FIG. 6, the photoresist layer 30', is shown, the sensitized area 31 (FIG. 5) of the resist layer being removed using conventional photoresist developing techniques for the particular resist to provide an aperture 31' having oblique sidewall portions 31a' and 31b'. Here oblique sidewall portion 31a' is disposed adjacent the drain electrode 26b and has a shallower slope than the corresponding sidewall portion 31b' disposed adjacent the source electrode 26a. The bottom portion of this layer, (i.e. the portion of the resist layer 30' disposed on the active region 11a) is used to provide a mask for a channel recess in the active region 11a. Here the channel recess is provided such that the channel is etched closer to the drain electrode 20b due to the asymmetric shape of the aperture 31'. With this technique it is possible to make asymmetric photoresist profiles. A gate electrode 27 is shown disposed in the recess provided in the active layer 11a. The gate electrode is provided by depositing suitable Schottky barrier contact metals and highly conductive metals, as is commonly known, over the substrate 11 with a portion of the metal layer 29 being disposed over the resist layer 30' in a second selected portion of said layer 29 being disposed in the gate recess aperture 11a' to provide the gate electrode 27.

In general, the oblique angle $\psi$ at which the energy is directed with respect to the normal to the substrate surface is in the range of 6° to 15° or higher, as shown. This angle is related to the angle at which the metal is deposited in the apertures. For example, in an evaporation technique using metals, such as gold, the metal typically arrives at the substrate with an incidence angle of up to about 2° to 4° off of a normal to the substrate surface. Accordingly, any angle greater than 4° would be adequate to provide the proper deposition direction for the metal from an evaporation technique.

Thus, while the oblique angle $\psi$ is generally the same for exposing of source and drain electrodes, for providing the gate electrode and the gate recess the illumination angles $\psi_1$ $\psi_2$ of a pair of illumination sources are generally different. Thus source 20a, which provides the retrograde sidewall portion 31a adjacent the source electrode, is a shallower angle $\psi_2$ than the corresponding angle $\psi_1$ of source 20b, which provides the retrograde sidewall portion 31b disposed adjacent the drain electrode 26a.

Described above is a technique in which two sources are used to provide a pair of retrograde sidewalls. However, in practice it would be generally preferred to provide retrograde sidewalls over all sidewalls of a patterned feature. Below are techniques for providing this arrangement.

Figure 7:
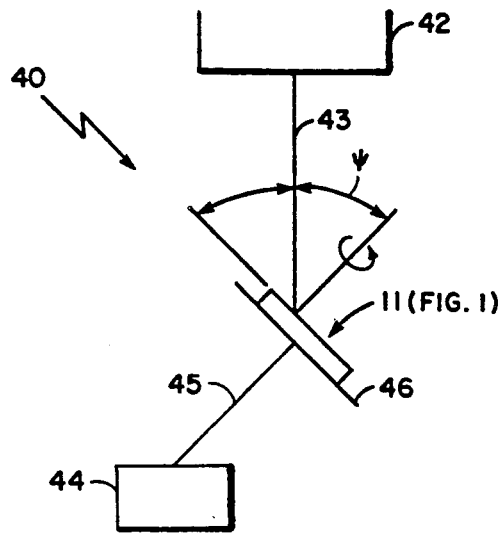
FIG. 7 is a diagrammatical view of a first technique to obliquely illuminate a resist layer.

Referring now to FIG. 7, a first apparatus 40 for providing the obliquely directed illumination and particularly adapted to demonstrate the concept is shown to include a source of collimated illumination 42 and a substrate holder 46 disposed in an oblique angle $\psi$ with respect to the collimated illumination emanating from source 42. The substrate 11 is disposed on the substrate holder 46 which is further supported by a shaft 45. The shaft 45 is disposed at an oblique angle of $90° - \psi$. Shaft 45 is coupled to a rotating means 44, such as a motor, to rotate shaft 45 in a predetermined direction at a predetermined speed to thereby rotate substrate holder 46 and substrate 11 at the angle $\psi$ through the illumination field 43. Substrate holder 46 is thus rotated by the shaft thus through an oblique angle $\psi$ with respect to the incident rays of source 42. Therefore, with this technique illumination is directed towards the pattern region shown on the substrate at the desired angle $\psi$.

Described below are alternative means for providing obliquely directed illumination using optical means to bend or reflect light at oblique incidence to a normal to a substrate surface.

Figure 8A:
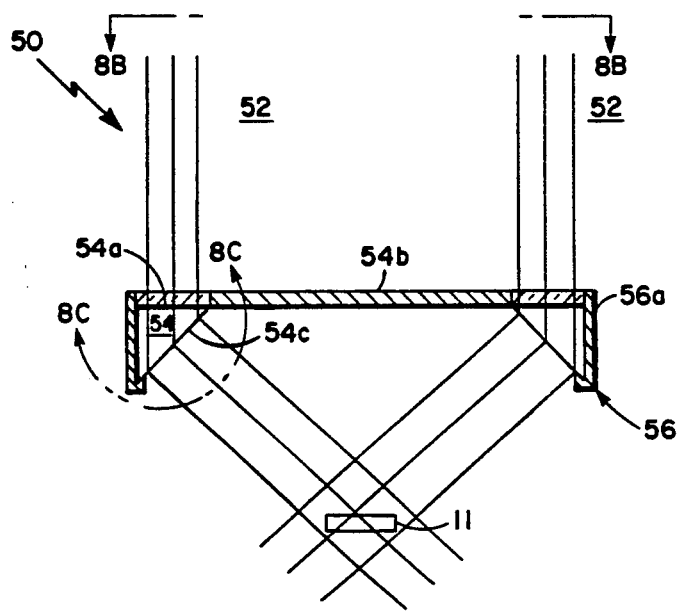
FIGS. 8A-8C are a series of diagrammatical views of a second technique using prisms to obliquely illuminate a resist layer with FIG. 8A being a cross-sectional view of a typical arrangement, FIG. 8B being a plan view taken along 8B—8B of FIG. 8A and FIG. 8C being a blown up view taken along line 8C—8C of FIG. 8B.
Figure 8C:
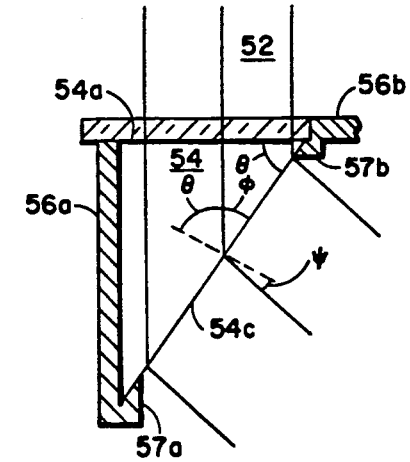
Figure 8B:
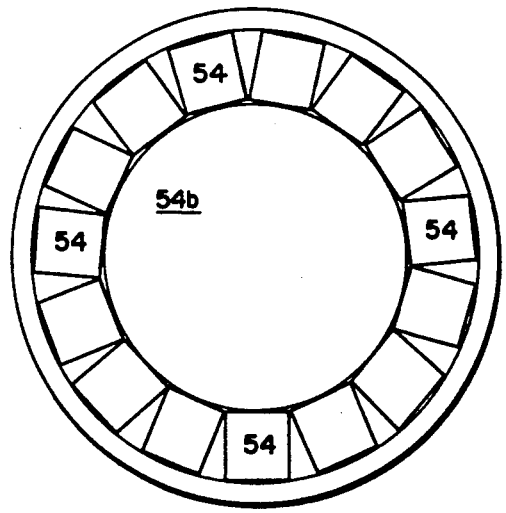

Referring now to FIGS. 8A–8C, a first apparatus 50 for providing the obliquely directed illumination is shown to include a source, not shown, of collimated illumination 52 and a plurality of prisms 54 here such prisms being right angle prisms having one face 54a of the prism used as an illuminating incident phase and the hypotenuse face 54c used as the exiting face. The prisms 54 are disposed in an annular prism holder 56. The holder 56 is here a frame having an outer vertical wall 56a with a notch 57 to receive a first acute angle portion of the prism as shown, as well as, a horizontal, central disk 54b, having a second notched portion 57b to receive the other acute angle portion of the prism, as shown. Collimated light entering face 54a of prism 54 will travel through said prism 54 exiting at face 54c at an angle $\psi$ which is determined by the acute angle $\phi$ which the face makes with the incident radiation. The substrate 11 is disposed in the region of said obliquely directed radiation, preferably at the region where the central rays of said radiation intersect. With this technique, by using different prisms, i.e. having different acute angles, tailoring of the ray patterns may also be provided.

For the arrangement shown in FIGS. 8A-8C, the angle of oblique illumination $\psi$ is related to the angle $\theta$ of the prism 54 as:

$n_1 \sin \theta = n_0 \sin \psi$ $\psi = \arcsin (n_1/n_0 \sin \theta)$

Referring now to FIG. 9, a further preferred apparatus 60 for forming obliquely directly illumination is shown to include an optical projection system 61 which provides a source of collimated beams or rays of radiation 61a. A radial gradient neutral density filter 62 and a transmitting conical prism 64 are disposed within the path of said beam 61, as shown. The radial gradient neutral density filter 62 is provided to insure uniform radiation and intensity at the substrate, as will be described. The transmitting conical prism 64 has sidewalls 64a' which meet at an acute angle $\phi$ with respect to the transmitting or exiting surface 64b thereof. The transmitting or exiting surface is disposed over the mask and wafer arrangement as shown in FIG. 1. Incident beams which enter the first face of the transmitting conical prism 64 are refracted at a first angle $\phi$. The angle $\phi$ is related to the different indices of refraction of the propagation medium and the medium of the prism using Snell's law as will be further described below. The beam 61' exits the prism 64 at the surface 64b and again is refracted by an angle related to the indices of refraction of the two mediums. The angle at which the energy exits the prism is at the desired oblique angle $\psi$. In general, the angle $\psi$ at which the resist is illuminated is related to the angle of incidence at the hypotenuse of the right angle prism as follows:

Using Snell's law:

$n_0 \sin (90 - \theta) = n_1 \sin \phi$ $\phi = \arcsin [(n_0/n_1) \sin (90 - \theta)]$ at the boundary of $n_0, n_1$ $n_0 \sin (\psi) = n_1 \sin (90 - (\theta + \arcsin ((n_0/n_1) \sin (90 - \phi))))$ $\psi = \arcsin ((n_1/n_0) \sin (90 - (\theta + \arcsin ((n_0/n_1) \sin (90 - \theta)))))$.

A Fresnel type of reduction lens 68 which provides a reduced height optical element equivalent to and which can be substituted for the conical transmitting prism of FIG. 9 is shown diagrammatically in FIG. 9A.

Referring now to FIG. 10, a second preferred apparatus 70 for providing obliquely directed illumination is shown to include an illuminator 71 which produces collimated rays of illumination 71a, a radial gradient neutral density filter 78 which allows uniform illumination of the substrate of a masking layer, as will be described, a reflecting conical mirror 76 disposed within the path of the rays 71a and a reflecting cylindrical mirror 74 disposed around the reflecting conical mirror 76. Rays 71a are directed through the gradient neutral density filter 78 towards the surface of the reflecting conical mirror 76. The filtered rays 71a' are reflected from the surface of the cylindrical mirror 76 at an angle of reflectance $\alpha$ equal to the angle of incidence $\alpha$. The reflected rays 71b are thus directed towards the reflecting cylindrical mirror 74 at an angle of $2\alpha$ with respect to the surface of the conical mirror 74. The complementary angle of $2\alpha$ is thus $90° - 2\alpha$. These incident rays again reflect off the surface of the cylindrical mirror 74 at an angle of reflection ($2\alpha$) equal to the angle of incidence $2\alpha$. Thus the rays 71c are directed towards the masked substrate 11 at the oblique angle of $2\alpha$ with respect to the normal or $90° - 2\alpha$ with respect to the substrate surface. Thus radiation is directed towards the substrate 11 at an oblique angle of $\psi = 2\alpha$ with respect to a normal to the surface of the substrate.

The use of the radial gradient neutral density filter 78 for the embodiment shown in FIGS. 9 and 10 is preferred because the use of the mirrors and/or the prisms may provide a non-uniform intensity of illumination at the substrate. By gradually filtering the intensity of the illumination to vary inversely as a function of a radial sector of the prism 64 (FIG. 9) or conical mirror 76 (FIG. 10). Such intensity of the incident beam will be more uniform over the surface of the substrate.

Having described preferred embodiments in the invention, it will now become apparent to one of skill in the art that other embodiments incorporating their concepts may be used. It is felt, therefore, that these embodiments should not be limited to disclosed embodiments, but rather should be limited only to by the spirit and scope of the appended claims.

What is claimed is:

1. Apparatus comprising:
   means for providing collimated optical energy;
   conical means disposed in a path of said directed optical energy for directing said energy over a surface area of a substrate in an oblique angle with respect to an angle of incidence of said directed optical energy;
   filtering means, disposed between said means for providing collimated optical energy and said conical means, for providing a reduction in the intensity of illumination of said collimated optical energy passing therethrough; and
   wherein said filtering means in combination with said conical means provides said collimated energy at a uniform intensity over said surface of said substrate.

2. Apparatus, as recited in claim 1, wherein said conical means includes a transmitting conical prism having an incidence surface disposed at an angle related to an angle at which the energy is obliquely directed.

3. The apparatus, as recited in claim 1, wherein said conical means includes a conical reflecting mirror and a cylindrical mirror with said conical reflecting mirror disposed within a reflecting portion of said cylindrical mirror.

4. The apparatus, as recited in claim 1, wherein said conical means includes a Fresnel lens reduction which provides, in response to optical energy directed at said lens, optical energy from said Fresnel lens at the desired oblique angle.

5. Apparatus as recited in claim 1, wherein said filtering means is a radial gradient neutral density filter, said filter gradually varying the intensity of the illumination as a function of a radial sector of said conical means.

* * * * *